United States Patent [19]
Bonaccio et al.

[11] Patent Number: 5,859,461
[45] Date of Patent: Jan. 12, 1999

[54] METHOD AND APPARATUS FOR INTERFACING INTEGRATED CIRCUITS HAVING DIFFERENT SUPPLY VOLTAGES

[75] Inventors: Anthony Richard Bonaccio, Shelburne; Wilbur David Pricer, Charlotte, both of Vt.

[73] Assignee: International Business Machines Corporation, Armonk, N.Y.

[21] Appl. No.: 829,708

[22] Filed: Mar. 28, 1997

[51] Int. Cl.$^6$ .................................................. H01L 29/76
[52] U.S. Cl. .............................................. 257/402; 327/74
[58] Field of Search ............................ 257/402; 327/72, 327/74; 375/317

[56] References Cited

U.S. PATENT DOCUMENTS

| | | |
|---|---|---|
| 3,638,183 | 1/1972 | Progler et al. . |
| 5,001,726 | 3/1991 | Kawai et al. . |
| 5,243,625 | 9/1993 | Verbakel et al. . |
| 5,295,155 | 3/1994 | Gersbach et al. . |
| 5,329,554 | 7/1994 | Behrens et al. . |
| 5,341,046 | 8/1994 | Crafts ....................................... 307/475 |
| 5,438,593 | 8/1995 | Karam et al. . |
| 5,497,117 | 3/1996 | Nakajima et al. ....................... 327/404 |
| 5,521,941 | 5/1996 | Wiatrowski et al. . |
| 5,539,779 | 7/1996 | Nagahori . |

*Primary Examiner*—David Nelms
*Assistant Examiner*—Hoai V. Ho
*Attorney, Agent, or Firm*—Eugene I. Shkurko

[57] ABSTRACT

An integrated circuit chip having circuitry to adjust its threshold voltage between a plurality of threshold voltages for interfacing to integrated circuit chips having different supply voltages. The integrated circuit chip also includes circuitry for communicating its threshold voltage level to a second integrated circuit such that the second integrated circuit may set its threshold voltage prior to receiving logic communications from the integrated circuit. The present invention also discloses an integrated circuit that detects the logic level of incoming logic communications and adjusts its threshold voltage accordingly.

6 Claims, 3 Drawing Sheets

METHOD AND APPARATUS FOR INTERFACING INTEGRATED CIRCUITS HAVING DIFFERENT SUPPLY VOLTAGES

CROSS-REFERENCE TO RELATED APPLICATION

A LOW VOLTAGE INPUT BUFFER FOR ASYMMETRICAL LOGIC SIGNALS, Ser. No. 08/769,976, filed Dec. 19, 1996, incorporated herein by reference.

FIELD OF THE INVENTION

The present invention relates generally to integrated circuits and more particularly to an apparatus and method for interfacing integrated circuits having different supply voltages.

BACKGROUND OF THE INVENTION

Several different integrated circuit technologies are available to circuit and system designers in which to realize their designs. These technologies include, for example, bipolar transistor-transistor logic (TTL), complementary metal oxide semiconductor (CMOS), bipolar-CMOS (Bi-CMOS), gallium arsenide (GaAs), and others. As would be expected, integrated circuits based on differing technologies are often required to operate within a single system and hence must communicate one with another. A common problem that must be dealt with is the differing voltage and logic levels associated with the differing technologies or between differing circuit families within a single technology. This problem is sometimes further exacerbated by supply voltage levels which may vary significantly, not only between different technologies but even amongst circuits of like technologies.

Thresholds of the input circuits need to be compatible with the input signal levels from the external source.

Patent application Ser. No. 08/769,976, A LOW VOLTAGE INPUT BUFFER FOR ASYMMETRICAL LOGIC SIGNALS filed Dec. 19, 1996, of common assignee herewith discloses an input buffer circuit for responding to logic signals centered around a known fixed threshold which respond to input signal levels from an external circuit and translate these into needed logic levels for the internal circuits. What is needed is an integrated circuit which responds to a multiplicity of logic thresholds.

SUMMARY OF THE INVENTION

Accordingly, the present invention provides an integrated circuit comprising at least one input terminal for receiving a threshold determination input and threshold selection circuitry operably associated with the input for changing the threshold voltage of the integrated circuit from a first threshold voltage to a second threshold voltage in response to the threshold determination input. Additionally, the integrated circuit may include at least one output terminal for sending a threshold determination to a second integrated circuit for setting the threshold voltage of the second integrated circuit.

The present invention also provides an integrated circuit comprising at least one bus input for receiving a logic input and threshold selection circuitry operably associated with the bus input for changing the threshold voltage of the integrated circuit from a first threshold voltage to a second threshold voltage in response to the logic input.

The present invention also provides a method for interfacing a first integrated circuit with integrated circuits having a range of supply voltages. The method comprises the steps of inputting a threshold determination input to the first integrated circuit and changing the threshold voltage of the first integrated circuit from a first threshold voltage to a second threshold voltage in response to the threshold determination input.

The present invention also provides a method for interfacing a first integrated circuit with integrated circuits having a range of supply voltages. The method comprises the steps of inputting a logic input to the first integrated circuit and changing the threshold voltage of the first integrated circuit from a first threshold voltage to a second threshold voltage in response to the logic input.

The primary advantage of the present invention is an integrated circuit having multiple threshold voltages so as to adapt to integrated circuits having a range of supply voltages.

Another advantage of the present invention is allowing a user to choose the threshold voltage implemented in an integrated circuit.

Another advantage of the present invention is allowing the threshold voltage of an integrated circuit to vary dynamically within a specific application when integrated circuits having different supply voltages share a common bus.

Another advantage of the present invention is using logic inputs to an integrated circuit to automatically select or adjust the threshold voltage of the integrated circuit.

DETAILED DESCRIPTION OF A PREFERRED EMBODIMENT OF THE INVENTION

In general, the present invention provides an integrated circuit which can be interfaced to integrated circuits having a range of power supplies and includes circuitry for communicating to other integrated circuits what their proper logic thresholds should be.

Figure 1:
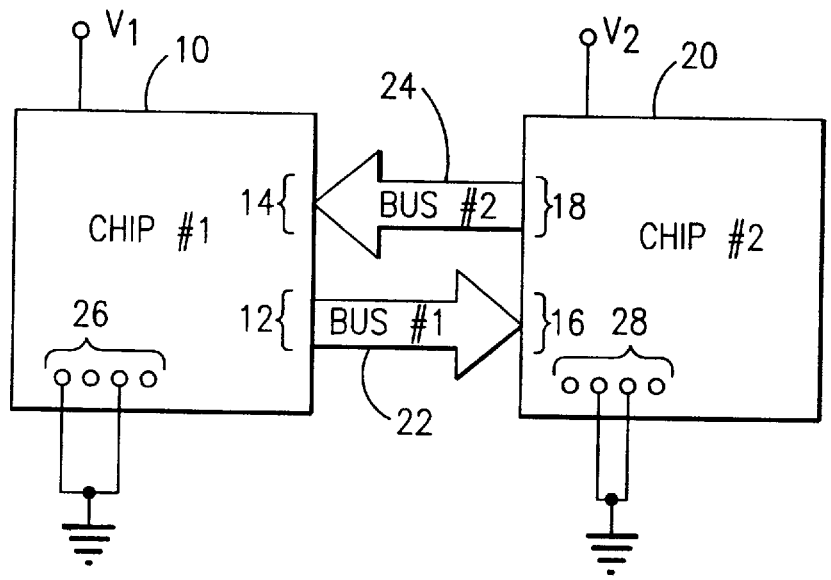
FIG. 1 illustrates a simple embodiment according to the present invention.

FIG. 1 illustrates integrated circuit chips 10 and 20 according to the present invention. Integrated circuit chip 10 has a supply voltage $V_1$, and integrated circuit chip 20 has a supply voltage $V_2$ which is different than supply voltage $V_1$. Integrated circuit chip 10 includes bus outputs 12 and bus inputs 14. Integrated circuit chip 20 includes bus inputs 16 and bus outputs 18. A first bus 22 couples bus outputs 12 of chip 10 to bus inputs 16 of chip 20 to carry information such as data, instructions or addresses from chip 10 to chip 20. A second bus 24 couples bus outputs 18 of chip 20 to bus inputs 14 of chip 10 to carry information such as data, instructions or and addresses from chip 20 to chip 10.

Information carried by first bus 22 has logic thresholds which directly correspond to supply voltage $V_1$ to chip 10. In a similar manner, information transmitted on second bus 24 has logic threshold voltages which directly correspond to supply voltage $V_2$ to chip 20. According to the present invention, chip 10 includes threshold determination code inputs 26, and integrated circuit chip 20 includes threshold determination code inputs 28. Threshold determination code inputs 26, 28, which in this illustration are hard-wired, input a standard binary code which represents the standard power supplies in common use. For example, by use of four binary values, the standard binary code might represent standard supplies 5 Volts, 3.3 Volts, 3.0 Volts, 2.5 Volts, 1.8 Volts, 1.5 Volts, 1.25 Volts, 1 Volt plus up to eight more standard power supplies yet to be determined. Some companies market adjustable voltage regulators which can be used to respond to the standard binary code of hardwire inputs to reduce a higher DC voltage supply as one input to any one of a number of the standard lower DC voltage supplies as an output. Code inputs 26 and 28 might use this same code.

Internally, integrated circuit logic chips 10, 20 decode the code inputted into inputs 26, 28 with the aid of an on-chip voltage source, e.g., band gap or work function to replicate the logic threshold as a voltage reference. The code can be statically implemented by shorting any of the four threshold determination inputs 26 or 28 to ground or allowing them to float under the influence of an input resistor or current source. The system designer can thus program the desired threshold into the integrated circuit chips 10 or 20.

The speed of the circuits within integrated circuit chips 10 and 20 which recognizes the code inputted into inputs 26, 28 is not an issue, since the code is essentially applied DC, fixing the threshold voltage of integrated circuit chips 10 or 20 prior to information being communicated to or from integrated circuit chip 10 to or from integrated circuit chip 20 via first bus 22 or second bus 24.

Figure 2:
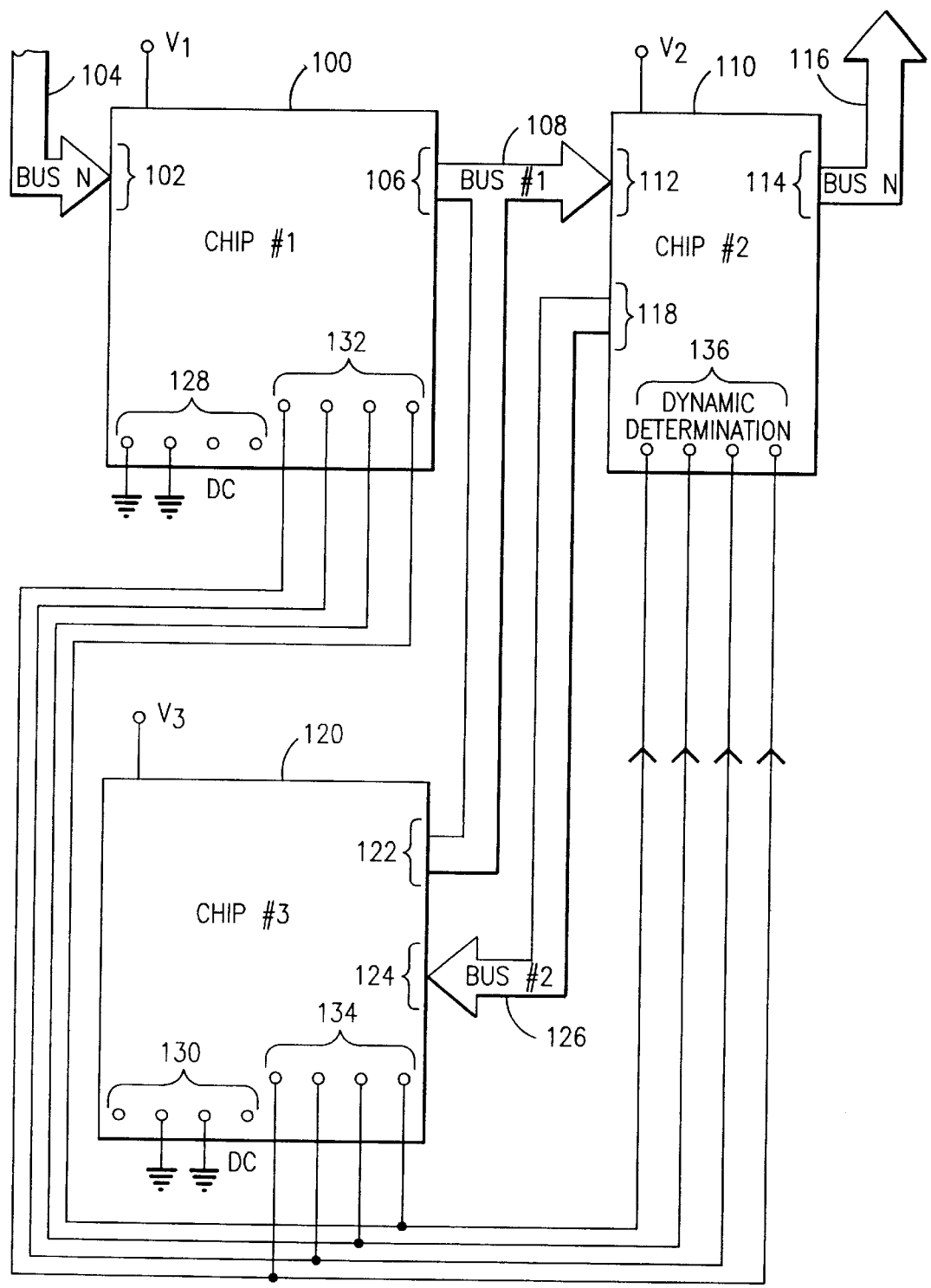
FIG. 2 illustrates an alternative, more complex embodiment according to the present invention.

FIG. 2 illustrates an alternative embodiment according to the present invention. FIG. 2 illustrates integrated circuit chips 100, 110, and 120. Integrated circuit chip 100 has a supply voltage $V_1$. Integrated circuit chip 110 has a supply voltage $V_2$, and integrated circuit chip 120 has a supply voltage $V_3$ wherein $V_1 \neq V_2 \neq V_3$.

Integrated circuit chip 100 includes bus inputs 102 coupled to bus 104 for receiving information such as data instructions or addresses from an external source (not shown) to integrated circuit chip 100. Integrated circuit chip 100 further includes bus outputs 106 coupled to a shared bus 108. Integrated circuit chip 110 includes bus inputs 112 coupled to shared bus 108 for receiving information such as data, instructions or addresses transmitted on shared bus 108 into integrated circuit chip 110. Integrated circuit chip 110 further includes bus outputs 114 coupled to bus 116 for sending information such as data, instruction or addresses from integrated circuit chip 110 to an external device (not shown). Integrated circuit chip 120 includes bus outputs 122 coupled to shared bus 108 for sending or transmitting information such as data, instructions or addresses from integrated circuit chip 120 to integrated circuit chip 110 via shared bus 108. Thus, integrated circuit chip 110 can receive information from integrated circuit chip 100 or integrated circuit chip 120 via shared bus 108.

Integrated circuit chip 120 further includes bus inputs 124 coupled to bus 126. Bus 126 is coupled to a second set of bus outputs 118 from integrated circuit chip 110. Thus, integrated circuit chip 110 sends information such as data or addresses from bus outputs 118 to bus inputs 124 of integrated circuit chip 120 via bus 126.

From this configuration, it can be seen that integrated circuit chip 100 needs to have its threshold voltage set to match the threshold voltage of the external source bringing information to integrated circuit chip 100 via bus 104. Since this can be predetermined, integrated circuit chip 100 includes threshold determination inputs 128. Threshold determination inputs 128 are identical to threshold determination inputs 26, 28 from FIG. 1 and thus can be hard-wired to code-in the threshold voltage.

In a similar matter, integrated circuit chip 120 includes threshold determination inputs 130 which are identical to threshold determination inputs 26, 28 from FIG. 1. Threshold determination inputs 130 are coded so that the threshold voltage selected for integrated circuit 120 matches the threshold voltage of integrated circuit chip 110 such that a proper switching point is established for information flowing from bus outputs 118 to bus inputs 124 via bus 126.

Since integrated circuit chip 110 can receive information from either chip 100 or chip 120 via shared bus 108, the threshold voltage of integrated circuit chip 110 cannot be statically determined as with integrated circuit chips 110, 120 via determination inputs 128, 130. Instead, integrated circuit chips 100, 120 must communicate with integrated circuit chip 110 to tell integrated circuit chip 110 that they are about to send information to integrated circuit chip 110, and therefore, integrated circuit chip 110 needs to adjust its threshold voltage.

In accordance with the invention, integrated circuit chip 100 and integrated circuit chip 120 are provided with threshold determination outputs 132 and 134, respectively. Threshold determination outputs 132 and 134 are coupled to threshold determination input 136 of integrated circuit chip 110. Threshold determination input 136 is identical to threshold determination inputs 128, 130.

In this manner, either integrated circuit chip 100 or integrated circuit chip 120 can select the threshold voltage used by integrated circuit chip 110 by coding threshold determination input 136. Thus, either chip 100 or chip 120 can determine the logic threshold which is to be used on bus 108. Here, the speed in which the circuits recognize the code is of some concern. The circuits must have time to settle before adjusting to new logic levels and prior to information being transmitted to integrated circuit chip 110 via shared bus 108. However, certain applications like the communications path between a microprocessor and synchronous DRAM will be relatively insensitive to the settling time, because changes in threshold occur infrequently.

Figure 3:
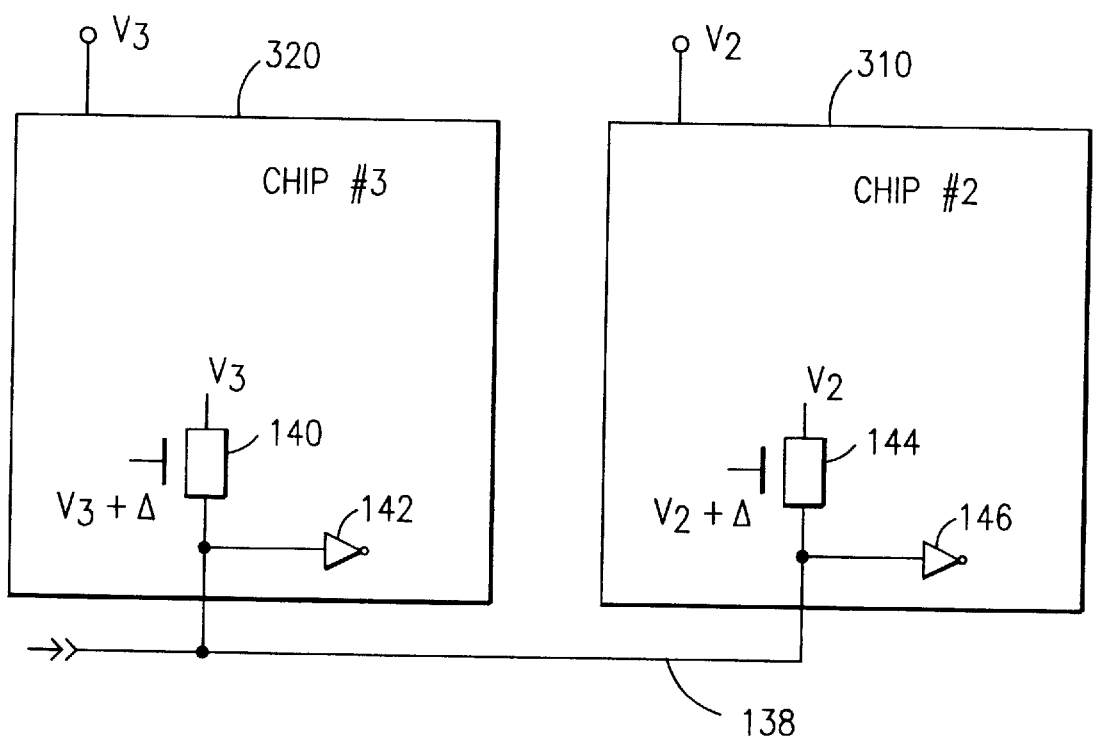
FIG. 3 provides greater details to the alternative embodiment of FIG. 2.

FIG. 3 illustrates integrated circuit chips 310 and 320 which share common lines or wires for threshold determination. One such line 138 is shown. Line 138 comes from two or more other chips. Reference numerals used in FIG. 3 which are like, similar, or identical to reference numerals used in FIG. 2 indicate like, similar, or identical components.

For example, a shared code line 138 may represent one of the four threshold code coupling threshold determination outputs 132, 134 to threshold determination input 136 as depicted in FIG. 2. Integrated circuit chip 320 includes field effect transistor (FET) 140 having its drain coupled to voltage supply source $V_3$, its gate coupled to a voltage source of $V_3+\nabla$, and its source coupled to the shared threshold code line 138 and to the input of an inverter 142.

In a similar manner, integrated circuit chip 310 includes a FET 144 having its drain coupled to voltage supply source $V_2$, its gate coupled to a voltage supply source $V_2+\nabla$, and its source coupled to code line 138 into the input of an inverter input buffer 146. FETs 140 and 144 are designed to allow common code lines, such as code line 138, to rise to a value only slightly less positive than the most positive chip supply voltage.

Figure 4:
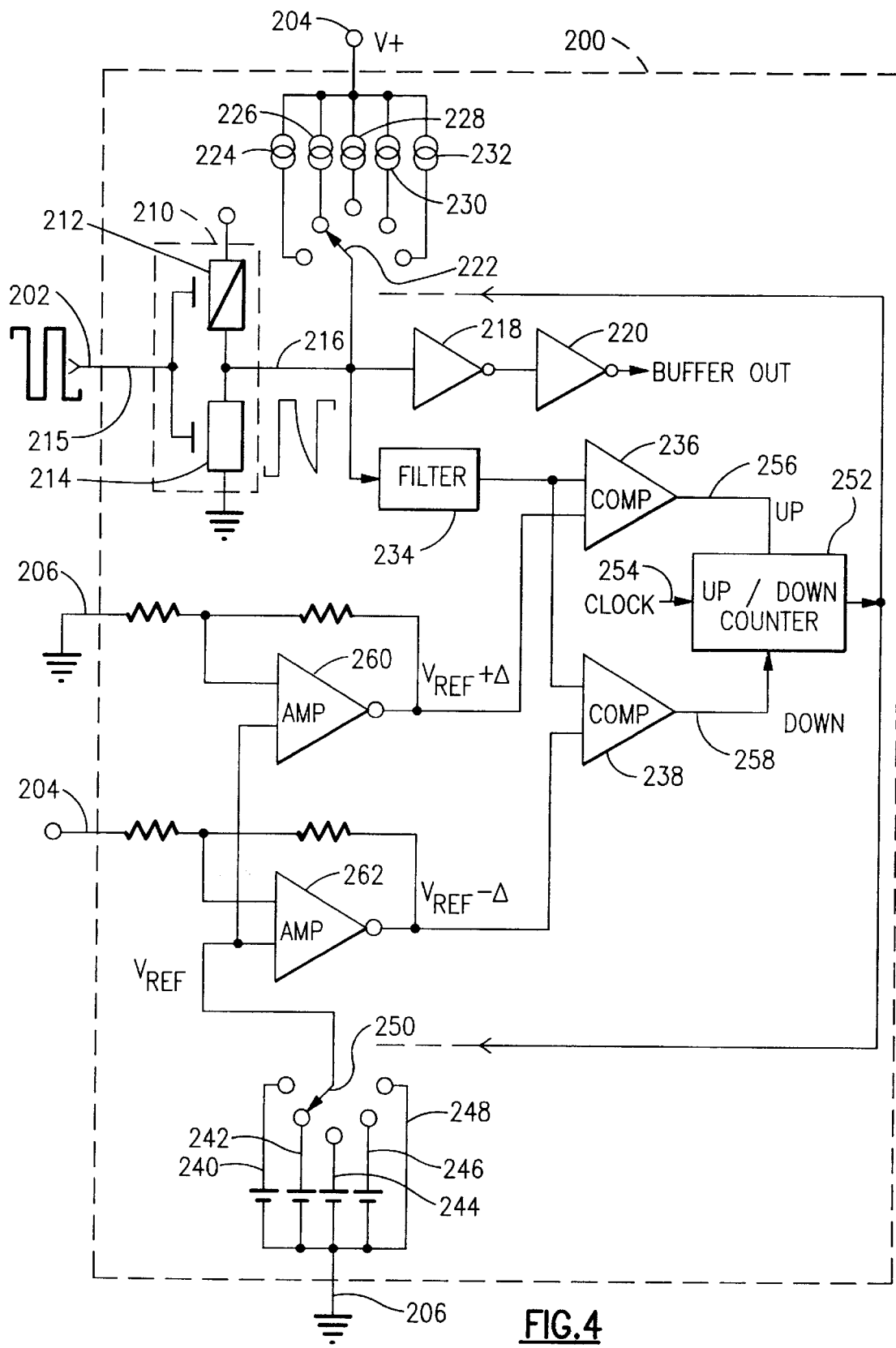
FIG. 4 illustrates yet another alternative embodiment according to the present invention in which the threshold is dynamically selected.

FIG. 4 illustrates yet another alternative embodiment of the present invention. FIG. 4 illustrates an integrated circuit chip 200 in which threshold code is not communicated either by hardwiring or by direct chip-to-chip communication such as illustrated in FIGS. 1–3. Instead, a sending integrated circuit chip (not shown) coaches or causes integrated circuit chip 200, which is the receiving chip, to set the threshold by example.

Integrated circuit chip 200 includes bus inputs 202 for receiving information such as data, addresses, or instructions from the sending integrated circuit chip. Prior to logic communication of the information, the sending integrated circuit chip sends a signal exhibiting or illustrating its own logic levels to bus inputs 202. If the receiving chip 200 does not have its threshold set properly, it will respond asymmetrically to this input. Internally, the receiving chip 200 detects both the asymmetry and direction of the asymmetry. Integrated circuit chip 200 responds by selecting a new threshold from among the assembly of threshold standards until the asymmetry is removed.

Integrated circuit chip 200 includes a voltage supply input 204 and a ground input 206. Integrated circuit chip 200 further includes input inverter 210 having an input 215 coupled to bus inputs 202 and an output 216 which comprises a P-type transistor 212 and an N-type transistor 214 coupled as is well known in the art. The output 216 of inverter 210 is coupled to a second inverter buffer 218. The output of inverter buffer 218 is coupled to the input of a third inverter buffer 220. The output of inverter buffer 220 is a signal to send throughout the integrated circuit. Output 216 is coupled to a rotater arm or selector 222 for selecting one of a plurality of current sources 224, 226, 228, 230, or 232.

As shown in FIG. 4, rotator/selector 222 is currently coupled to current source 226. Output 216 is also coupled to the input of filter 234. Preferably, filter 234 is a low pass filter for averaging the voltage at output 216 or, in other words, finding the average of the input signal as seen at output 216. The output of filter 234 is coupled to comparators 236, 238.

Integrated circuit chip 200 further includes a plurality of voltage sources 240, 242, 244, 246, and 248 corresponding to the standard supply voltage, for example, 5 Volts, 3.3 Volts, 3 Volts, 2.5 Volts, and 1.8 Volts, respectively. Voltages 240, 242, 244, 246 and 248 are equal to the desired threshold voltages. Voltage sources 240, 242, 244, 246, and 248 are paired with current sources 224, 226, 228, 230, 232 such that voltage source 240 corresponds to current source 224, voltage source 242 corresponds to current source 226, voltage source 244 is paired or corresponds to current source 228, and voltage source 246 is paired or corresponds to current source 230, and voltage source 248 is paired or corresponds to current source 232.

A voltage source selector/rotator 250 selects one of the voltage sources 240, 242, 244, 246, 248 as shown in FIG. 4. Rotator/selector 250 selects a voltage source corresponding to the current source selected by rotator/selector 222. since current source 226 is selected or has been selected by rotator/selector 226, voltage source 242 is selected by rotator/selector 250.

Rotator/selector 250 and rotator 222 are controlled by up-down counter 252. Up-down counter 252 includes a clock input 254, an up indicating input 256 coupled to the output of comparator 236 and a down indicating input 258 coupled to the output of comparator 238. Selector/rotator 250 selects the current threshold voltage utilized by integrated circuit chip 200 or, in other words, the current reference threshold voltage.

Selector 250 is coupled to the inputs of amplifiers 260 and 262. Amplifiers 260, 262 are configured in a conventional manner as is well known in the art such that amplifier 260 generates an output voltage of Vref+∇, and amplifier 262 produces an output voltage of Vref−∇. The output of amplifier 260 is coupled to comparator 236, whereas the output of amplifier 262 is coupled to comparator 238.

In this system, there must be some way of communicating when the new threshold is being communicated "by example." This can be a single separate wire between the chips, a mutually agreed upon time period as set by a common clock, or by easily recognized behavior. For instance, a very rapid square wave inputted into bus inputs 202 could be recognized by the closeness of its transients to be a calibration signal and not data communication. Also, the absence of other signals such as "data valid" or the presence of some otherwise invalid code may be used to signal the arrival of the calibration signal.

Although the present invention and its advantages have been described in detail, it should be understood that various changes, substitutions and alterations can be made herein without departing from the spirit or scope of the invention as defined in the appended claims.

What is claimed is:

1. An integrated circuit comprising:
   at least one input for receiving a threshold determination input;
   threshold selection means operably associated with said input for changing a threshold voltage of said integrated circuit from a first threshold voltage to a second threshold voltage in response to said threshold determination input; and
   at least one bus input for receiving a logic input.

2. An integrated circuit comprising:
   at least one bus input for receiving a logic input;
   threshold selection means operably associated with said input for changing the threshold voltage of said integrated circuit from a first threshold voltage to a second threshold voltage in response to said logic input, wherein said threshold selection means comprises:
   a plurality of threshold voltage sources;
   switch means for selecting a threshold voltage from one of said plurality of threshold voltage sources;
   a plurality of current sources;
   an input inverter having an input operably coupled to said bus input and an output operably coupled to a selected one of said plurality of current sources;
   filter means operably coupled to said output of said input inverter for determining an average voltage at said output; and
   comparator means for comparing said average voltage to a reference threshold voltage selected from said plurality of threshold voltage sources.

3. The integrated circuit, as recited in claim 2, wherein each threshold voltage source from said plurality of threshold voltage sources is paired with a corresponding current source from said plurality of current sources such that said switch means selects a paired threshold and current source in response to the comparison by said comparator means.

4. A method for interfacing a first integrated circuit with integrated circuits having a range of supply voltages, said method comprising the steps of:
   inputting a threshold determination input to the first integrated circuit;
   changing a threshold voltage of the first integrated circuit from a first threshold voltage to a second threshold voltage in response to the threshold determination input; and wherein the first integrated circuit includes at least one bus input for receiving a logic input.

5. A method for interfacing a first integrated circuit with integrated circuits having a range of supply voltage, said method comprising the steps of:

inputting a logic input to the first integrated circuit;

changing a threshold voltage of the first integrated circuit from a first threshold voltage to a second threshold voltage in response to the logic input;

providing, in the first integrated circuit, a plurality of threshold voltage sources;

selecting a threshold voltage from one of the plurality of threshold voltage sources;

providing a plurality of current sources and an input inverter having a bus input for receiving the logic input and an output operably coupled to a filter and to a selected one of the plurality of current sources;

determining, with the filter, an average voltage at the output of the inverter; and comparing the average voltage to a reference threshold voltage selected from the plurality of threshold voltage sources.

6. The method, as recited in claim 5, wherein each threshold voltage source from the plurality of threshold voltage sources is paired with a corresponding current source from the plurality of current sources such that the switching step selects a paired threshold and current source in response to the comparison in the comparing step.

* * * * *